(12) United States Patent
Oh et al.

(10) Patent No.: US 9,523,713 B2
(45) Date of Patent: Dec. 20, 2016

(54) INTERCONNECTS INCLUDING LIQUID METAL

(71) Applicant: INTEL CORPORATION, Santa Clara, CA (US)

(72) Inventors: Youngseok Oh, Porland, OR (US); Joe F. Walczyk, Tigard, OR (US); Jin Yang, Hillsboro, OR (US); Pooya Tadayon, Hillsboro, OR (US); Ting Zhong, Tigard, OR (US)

(73) Assignee: INTEL CORPORATION, Santa Clara, CA (US)

( * ) Notice: Subject to any disclaimer, the term of this patent is extended or adjusted under 35 U.S.C. 154(b) by 360 days.

(21) Appl. No.: 13/903,874

(22) Filed: May 28, 2013

(65) Prior Publication Data

US 2014/0354318 A1    Dec. 4, 2014

(51) Int. Cl.
G01R 1/067    (2006.01)
G01R 1/073    (2006.01)

(52) U.S. Cl.
CPC ....... *G01R 1/06783* (2013.01); *G01R 1/07307* (2013.01); *Y10T 29/49124* (2015.01)

(58) Field of Classification Search
USPC ............ 324/754.04, 755.01, 755.11, 756.01, 324/762.01, 762.05, 547, 757.01, 757.05, 324/691, 756.03, 658, 756.02, 756.05, 324/754.03, 750.25, 754.07, 755.05, 324/762.03, 750.19, 750.26, 750.3, 324/754.08, 754.11, 755.08, 756.07, 324/762.02; 257/713, 777, 774, 257/E21.499, E23.145, E21.575, E21.577, 257/E21.705, E23.023; 438/67, 98, 107, 438/667, 618, 637; 361/699, 748, 760, 361/783; 330/307; 29/846, 874, 884, 593, 29/825
See application file for complete search history.

(56) References Cited

U.S. PATENT DOCUMENTS

| | | | |
|---|---|---|---|
| 7,427,809 B2* | 9/2008 | Salmon | H01L 21/4853 257/719 |
| 7,939,945 B2* | 5/2011 | Sauciuc | H05K 3/321 257/774 |
| 8,477,500 B2* | 7/2013 | Deng et al. | 361/710 |
| 2002/0050404 A1* | 5/2002 | Akamatsu et al. | 174/260 |
| 2006/0131728 A1* | 6/2006 | Salmon | 257/698 |
| 2008/0246501 A1* | 10/2008 | Williams et al. | 324/762 |
| 2009/0237099 A1* | 9/2009 | Garabedian et al. | 324/754 |
| 2009/0273083 A1* | 11/2009 | Sauciuc | H05K 3/321 257/741 |
| 2010/0083489 A1* | 4/2010 | Eldridge et al. | 29/825 |
| 2010/0237889 A1* | 9/2010 | Desta et al. | 324/757 |
| 2013/0135001 A1* | 5/2013 | Breinlinger | G01R 1/067 324/754.03 |

* cited by examiner

*Primary Examiner* — Daniel Miller
*Assistant Examiner* — Nasima Monsur
(74) *Attorney, Agent, or Firm* — Schwabe, Williamson & Wyatt, P.C.

(57) ABSTRACT

Embodiments of the present disclosure are directed to interconnects that include liquid metal, and associated techniques and configurations. The individual interconnects may electrically couple a contact of a printed circuit board (PCB) to a contact of a device under test (DUT). The interconnect may be disposed in or on the PCB. In various embodiments, the interconnect may include a carrier that defines a well (e.g., an opening in the carrier), and the liquid metal may be disposed in the well. In some embodiments, the contact of the DUT, or a contact of an intermediary device, may extend into the well and directly contact the liquid metal. In other embodiments, a flex circuit may be disposed over the well to seal the well. The flex circuit may include a conductive pad to electrically couple the liquid metal to the contact of the DUT. Other embodiments may be described and claimed.

16 Claims, 4 Drawing Sheets

INTERCONNECTS INCLUDING LIQUID METAL

FIELD

Embodiments of the present disclosure generally relate to the field of electrical devices, and more particularly, to interconnects including liquid metal.

BACKGROUND

The hardware for semiconductor device testing typically includes interconnects to establish temporary electrical connections with a device under test (DUT). The interconnects must provide some compliance (e.g., axial movement) to ensure that the interconnects successfully connect to the pins of the DUT. Accordingly, some interconnects (referred to as pogo-pin interconnects), include an internal spring connected between two pinheads. Another type of interconnects (referred to as braid interconnects) includes braided wire inside a polymer jacket. However, these interconnects have complex designs involving many components, which may increase the cost and complexity of the interconnects.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
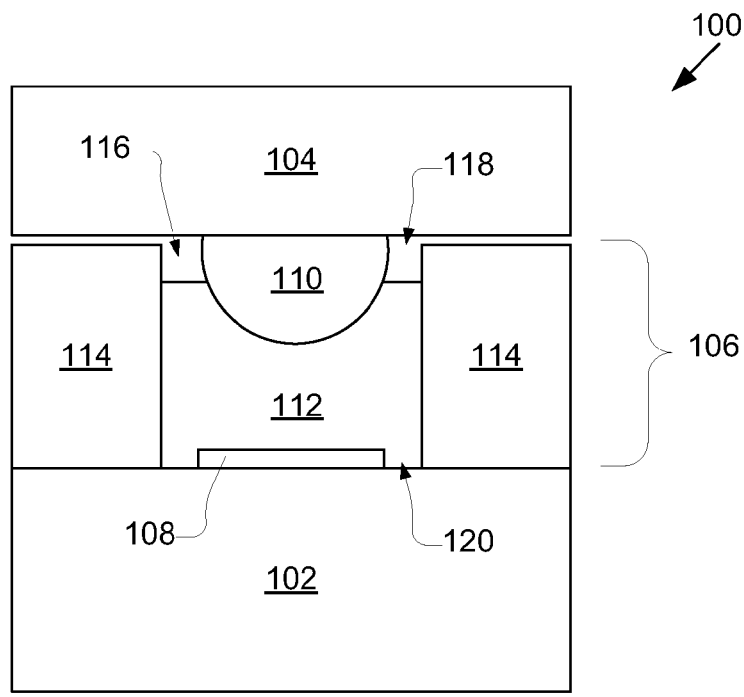
FIG. 1 schematically illustrates a system including an interconnect with liquid metal to electrically couple a printed circuit board (PCB) to a device, in accordance with some embodiments.

Embodiments of the present disclosure describe interconnects including liquid metal, and associated techniques and configurations. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Embodiments herein provide an interconnect assembly having one or more interconnects that include liquid metal. The interconnects may electrically couple a contact of a printed circuit board (PCB) to a contact of a device under test (DUT). In some embodiments, the electrical coupling may be temporary to allow the DUT to be coupled and uncoupled from the PCB. The interconnects may be directly coupled to the DUT or may be electrically coupled to the DUT via an intermediary device, such as a space transformer. The interconnects may be disposed in or on the PCB. In various embodiments, the interconnects may include a carrier that defines a well (e.g., an opening in the carrier), and the liquid metal may be disposed in the well. In some embodiments, the carrier may include a carrier layer disposed on the PCB. Alternatively, or additionally, the carrier may be integrated into the PCB, with the well formed in the PCB.

In various embodiments, the well may include a bottom side adjacent the PCB and a top side opposite the bottom side. In some embodiments, the top side of the well (e.g., opposite the PCB) may be open, and the contact of the DUT (or a contact of an intermediary device, such as a space transformer or an interposer) may extend into the well and directly contact the liquid metal. In other embodiments, the top side of the well may be sealed by a flex circuit. The flex circuit may include a conductive pad to electrically connect the liquid metal to the contact of the DUT or the intermediary device.

In some embodiments, the bottom side of the well may be sealed by the PCB (e.g., with the carrier disposed directly on the PCB). In other embodiments, the bottom side of the well may be sealed by a flex circuit. The flex circuit may include a conductive pad to electrically connect the liquid metal to the contact of the PCB.

FIG. 1 illustrates a system 100 that includes a PCB 102 that is electrically connected to a device 104 by an interconnect 106 in accordance with some embodiments. The PCB 102 may include a contact 108, and the device 104 may include a contact 110. In some embodiments, the PCB 102 may be included in a testing assembly used to test a DUT, such as an integrated circuit assembly. For example, the device 104 may be a DUT (e.g., an integrated circuit package assembly such as, for example, a package substrate or a component of an integrated circuit package assembly such as, for example, a die) and/or an intermediary device (e.g., a space transformer or interposer) that electrically couples contact 110 to a contact of a DUT. In some embodiments, the testing assembly may include a socket (not shown).

In various embodiments, the interconnect 106 may form a temporary electrical connection between the contact 108 and the contact 110. For example, the contact 110 may be uncoupled from the interconnect 106 after testing of the DUT.

Figure 3:
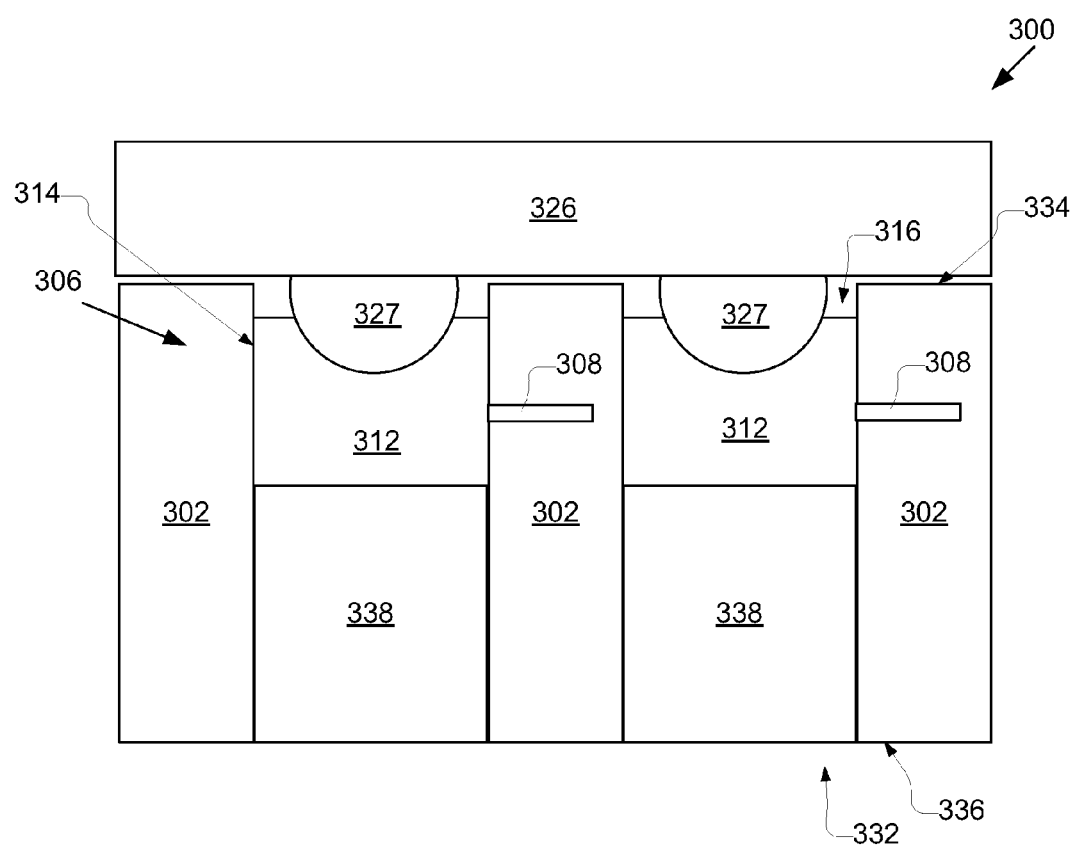
FIG. 3 schematically illustrates a PCB with integrated interconnects that include liquid metal, in accordance with some embodiments. The PCB is illustrated as part of a system that includes a DUT electrically coupled to the PCB via the interconnects.

As shown in FIG. 1, the interconnect 106 may be disposed on the PCB 102. Alternatively, as shown in FIG. 3 and further discussed below, the interconnect may be integrated into the PCB.

In various embodiments, the interconnect 106 may include liquid metal 112, and the interconnect 106 may electrically connect the contact 108 of the PCB 102 to the contact 110 of the device 104. As discussed above, the contact 110 may be part of the DUT or electrically coupled to the DUT. Accordingly, the interconnect 106 may electrically couple the contact 108 of the PCB 102 to the DUT.

In various embodiments, the interconnect 106 may include a carrier 114 that defines a well 116. The liquid metal 112 may be disposed in the well. For example, the liquid metal 112 may be disposed between a top side 118 of the well 116 and a bottom side 120 of the well 116. In the embodiment shown in FIG. 1, the top side 118 of the well 116 may be open (e.g., uncovered). Accordingly, the contact 110 of the device 104 may directly contact the liquid metal 112. In other embodiments, the top side 118 of the well 116 may be covered and/or sealed (e.g., by a flex circuit), as further discussed below.

In some embodiments, the contact 110 of the device 104 may be an extruded contact (e.g., a ball grid array (BGA) contact, land grid array (LGA) contact, etc.) that extends from the surface of the device 104. Accordingly, the contact 110 may extend into the well 116 to directly contact the liquid metal 112.

As described herein, "liquid metal" may refer to any conductive material with a melting point at or below the maximum temperature during testing of the DUT. For example, the liquid metal may have a melting temperature of about 50 degrees Celsius or below. The liquid metal may include, for example, a Gallium alloy and/or another suitable material.

With the top side 118 open, the contact 110 may become at least partially immersed in the liquid metal 112. Accordingly, the liquid metal 112 may provide "compliance" for the interconnect 106. The compliance of the interconnect 106 may be defined as the axial distance (e.g., along the axis between the contacts 108 and 110) over which the contact 110 may be disposed with respect to the interconnect 106 while maintaining an electrical connection between the contact 110 and the interconnect 106. Accordingly, the liquid metal 112 may allow the interconnect 106 to form an electrical connection between the contact 108 and the contact 110 over a range of relative positions of the contact 110 with respect to the interconnect 106 (e.g., different depths of the contact 110 in the well 116).

Additionally, the liquid metal 112 may provide an increased contact surface between the interconnect 106 and the contact 110 compared with prior interconnects. This may provide a low resistance for the electrical path between the contact 110 and the interconnect 106, thereby providing improved performance for the system 100.

In some embodiments, as shown in FIG. 1, the carrier 114 may include a carrier layer disposed on the PCB 102. A hole may be formed in the carrier layer to form well 116. The carrier 114 may be formed of any suitable non-conductive material. In some embodiments, the carrier 114 may be substantially rigid.

In some embodiments, the carrier 114 may include a plurality of wells, and each well may include liquid metal disposed therein to form an interconnect.

Figure 2:
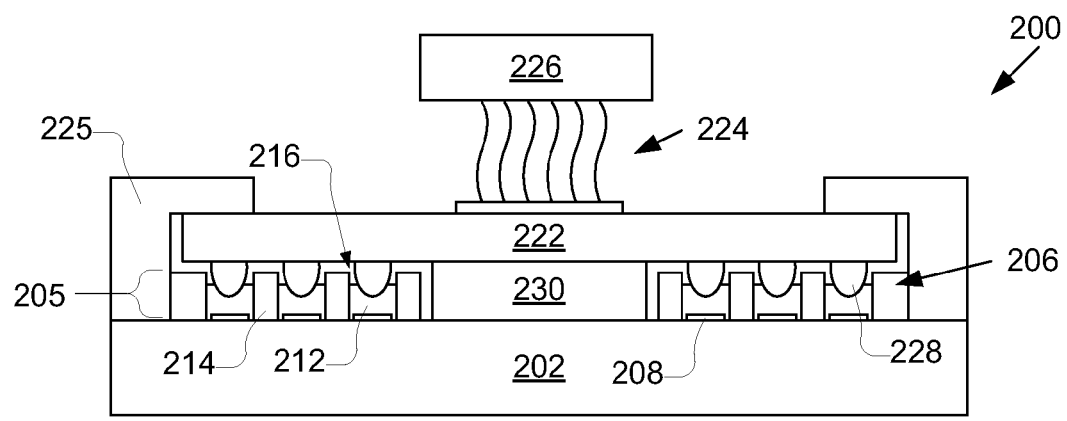
FIG. 2 schematically illustrates a system including a plurality of interconnects electrically coupling a PCB to a device under test (DUT) via a space transformer and a probe head, in accordance with some embodiments.

For example, FIG. 2 illustrates a system 200 with an interconnect assembly 205 having a plurality of interconnects 206. The interconnect assembly 205 includes a carrier 214 disposed on a PCB 202 (e.g., in a separate carrier layer). The carrier 214 includes a plurality of wells 216 over respective contacts 208 of the PCB 202. The wells 216 may include liquid metal 212 disposed therein. The liquid metal 212 may be in direct contact with the respective contacts 208 of the PCB 202. Although a cross-sectional view of system 200 is shown in FIG. 2, it is understood that in some embodiments, the system 200 may include additional interconnects 206 in other cross-sectional planes.

As shown in FIG. 2, the system 200 may further include a space transformer 222 and probe head 224 to facilitate electrical connections between the interconnects 206 (and thereby the contacts 208) and respective contacts of a DUT 226 (e.g., an integrated circuit assembly). The space transformer 222 may include contacts 228 coupled to respective interconnects 206. For example, the contacts 228 may extend into the wells 216 and may be in direct contact with the liquid metal 212 of respective interconnects 206. The probe head 224 may be coupled to the space transformer 222 and may electrically couple the interconnects 206 to respective contacts of the DUT 226 via the space transformer 222. In some embodiments, the system 200 may include a support structure 230 between the space transformer 222 and PCB 202 to transfer some or all of the weight of the space transformer 222 to the PCB 202 rather than the interconnect assembly 205.

In some embodiments, the system 200 may include a holding structure 225 that may keep the space transformer 222 coupled to the interconnects 206. The holding structure 225 may be removable to facilitate coupling and/or uncoupling of the space transformer 222 to the interconnects 206. For example, the holding structure 225 may be coupled to the PCB 202 by one or more screws (not shown).

As further discussed elsewhere herein, in other embodiments, the contacts of the DUT 226 may be directly coupled to the interconnects 206.

FIG. 3 illustrates a system 300 that is similar to system 200 except that the interconnects 306 are integrated into the PCB 302. Additionally, the system 300 includes a DUT 326 having contacts 327 that are directly coupled to respective interconnects 306.

PCB 302 may include an integrated carrier 314 having wells 316 formed directly in the PCB 302. Liquid metal 312 may be disposed in the wells 316 to form respective interconnects 306. In some embodiments, vias 332 may be formed in the PCB 302, extending through the PCB 302 from a first side 334 (e.g., top side) of the PCB 302 to a second side 336 (e.g., bottom side), opposite the first side 334. A non-conductive plug 338 may be disposed in a portion of the via 332 adjacent the second side 336 to define the well 316. For example, the plug 338 may be inserted into the second side 336 of the PCB 302 after formation of the via 332. Alternatively, the wells 316 may be formed by forming holes in the first side 334 of the PCB 302 that extend only partially through the PCB 302.

The liquid metal 312 may electrically couple contacts 308 of the PCB 302 to respective contacts 327 of the DUT 326. The integrated interconnects 306 may provide a shorter electrical path between the DUT 326 and circuitry on or coupled to the PCB 302 than the interconnects 106 and/or 206 discussed above, which may improve performance of the system 300.

Figure 4:
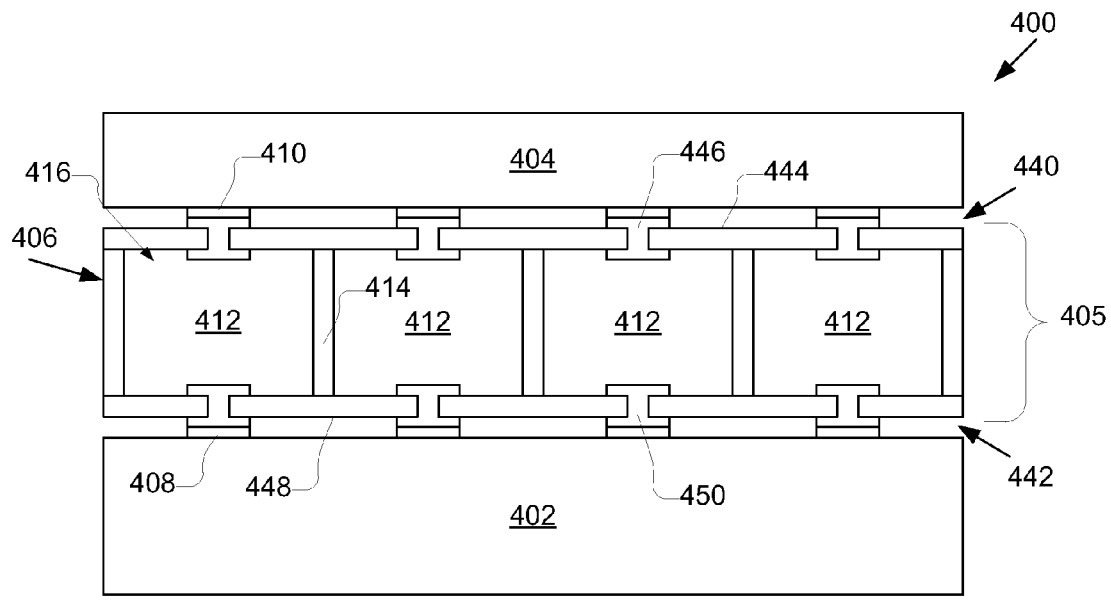
FIG. 4 illustrates a system including interconnects with respective wells of the interconnects sealed by top and bottom flex circuits in accordance with some embodiments.

FIG. 4 illustrates a system 400 that includes an interconnect assembly 405 having wells 416 that are sealed by a top flex circuit 440 and a bottom flex circuit 442. The wells 416 are formed in a carrier 414 of the interconnect assembly 405. Liquid metal 412 is disposed in the wells 416 to form respective interconnects 406 of the interconnect assembly 405.

The interconnect assembly 405 may be disposed between a PCB 402 and a device 404. The interconnects 406 of the interconnect assembly 405 may electrically couple contacts 408 of the PCB 402 to respective contacts 410 of the device 404.

The top flex circuit 440 may be disposed between the carrier 414 and the device 404. The top flex circuit 440 may include a base 444 with conductive pads 446 disposed through the base 444 and aligned with individual wells 416. The conductive pads 446 may electrically connect the liquid metal 412 of respective interconnects 406 to respective contacts 410 of the device 404. The conductive pads 446 of the top flex circuit 440 may allow the interconnects 406 to connect with contacts 410 of the device 404 that are not extruded (e.g., do not extend significantly from the surface of the device 404), such as pad contacts.

The bottom flex circuit 442 may be disposed between the carrier 414 and the PCB 402. The bottom flex circuit 442 may include a base 448 with conductive pads 450 disposed through the base 448 and aligned with individual wells 416. The conductive pads 450 may electrically connect the liquid metal 412 of respective interconnects 406 to respective contacts 408 of the PCB 402.

In some embodiments, the carrier 414 may be formed of a flexible material, such as an elastomer. The flexible material of the carrier 414, along with the top flex circuit 440 and the liquid metal 412, may provide compliance for the interconnects 406. For example, the conductive pads 446 of the top flex circuit 440 may be pressed down by the contacts 410 of device 402, thereby compressing the interconnects 406.

In some embodiments, the interconnect assembly 405 may be assembled prior to coupling the interconnect assembly 405 to the PCB 402. For example, one of the flex circuits (e.g., the top flex circuit 440 or bottom flex circuit 442) may be coupled to a first side of the carrier 414. The liquid metal 412 may then be deposited in the wells 416 of the carrier 414. Then, the other flex circuit (e.g., the bottom flex circuit 442 or top flex circuit 440) may be coupled to a second side of the carrier 414 to seal the wells 416.

Alternatively, the interconnect assembly 405 may be at least partially assembled on the PCB 402.

Figure 5:
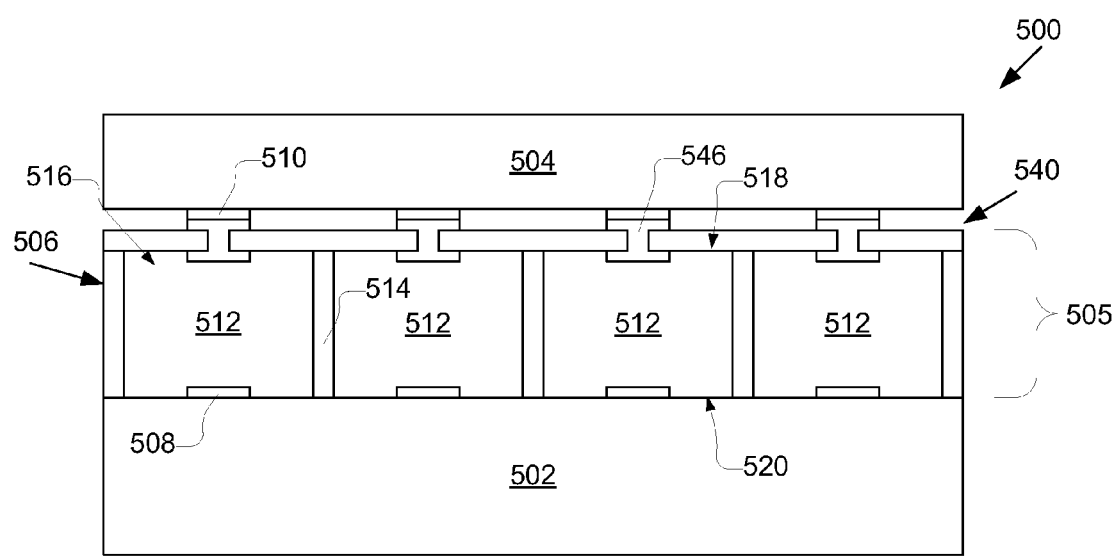
FIG. 5 illustrates a system including interconnects with respective wells of the interconnects sealed on a top side by a top flex circuit and on a bottom side by a PCB, in accordance with some embodiments.

In some embodiments, the interconnect assembly 405 may not include the bottom flex circuit 442. For example, FIG. 5 illustrates a system 500 including an interconnect assembly 505 that has a top flex circuit 540 but no bottom flex circuit. The interconnect assembly 505 includes a carrier 514 with wells 516 having a top side 518 and a bottom side 520. Liquid metal 512 may be disposed in the wells 516 to form interconnects 506.

The top flex circuit 540 may be coupled to the carrier 514 and may cover the top side 518 of the wells 516. The top flex circuit 540 includes conductive pads 546 to electrically couple the liquid metal 512 of respective interconnects 506 to respective contacts 510 of device 504.

In some embodiments, the bottom side 520 of the wells 516 may be sealed by the PCB 502. The carrier 514 may be directly coupled to the PCB 502, with the wells 516 disposed above respective contacts 508 of the PCB 502. Accordingly, the liquid metal 512 may be in direct contact with the contacts 508 of the PCB 502, which may provide a shorter electrical path length and/or an interconnect assembly 505 with fewer components compared with the interconnect assembly 405 discussed above.

Figure 6:
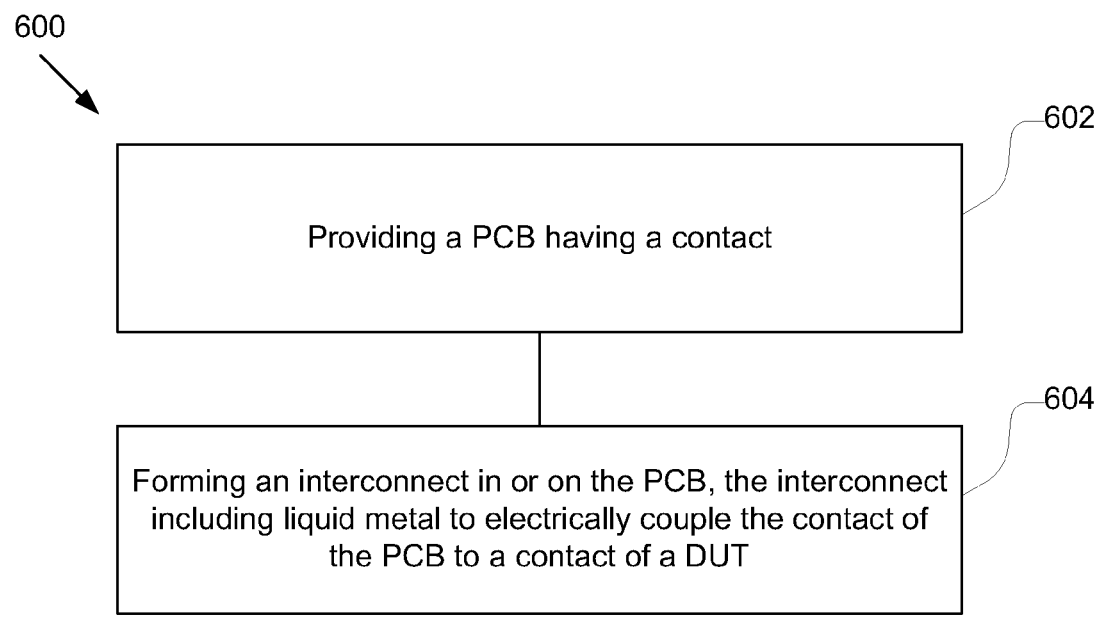
FIG. 6 illustrates a flowchart of a method of manufacturing an interconnect in accordance with some embodiments.

FIG. 6 illustrates a method for manufacturing an interconnect (e.g., interconnect 106, 206, 306, 406, or 506) and/or testing system (e.g., system 100, 200, 300, 400, or 500) in accordance with some embodiments. The method 600 may comport with embodiments described in connection with FIGS. 1-5.

At 602, method 600 may include providing a PCB (e.g., PCB 102, 202, 302, 402, or 502) having a contact. The PCB may be included in a testing assembly for testing a DUT, such as an integrated circuit assembly.

At 604, method 600 may include forming an interconnect in or on the PCB, the interconnect including liquid metal (e.g., liquid metal 112, 212, 312, 412, or 512). The interconnect may electrically connect the contact of the PCB to a contact of a DUT.

In some embodiments, forming the interconnect may include forming a well in a carrier that is disposed on or integrated in the PCB. Forming the interconnect may further include depositing the liquid metal in the well.

In some embodiments, the liquid metal may directly contact the contact of the DUT or a contact of an intermediary device that routes electrical signals from the interconnect to the DUT (e.g., a space transformer).

In other embodiments, forming the interconnect may further include coupling a top flex circuit to a top side of the carrier. The top flex circuit may cover the top opening of the well (e.g., with the liquid metal disposed between the top opening and the PCB). The top flex circuit may include a conductive pad to electrically couple the liquid metal to the contact of the DUT.

Additionally, or alternatively, to forming coupling the top flex circuit to a top side of the carrier, in some embodiments, forming the interconnect may include coupling a bottom flex circuit to a bottom side of the carrier (e.g., between the carrier and the PCB). The bottom flex circuit may cover a bottom opening of the well (e.g., opposite the top opening). The bottom flex circuit may include a conductive pad to electrically couple the contact of the PCB to the liquid metal.

EXAMPLES

In one example, an apparatus for electrically coupling a printed circuit board (PCB) to a device under test (DUT) is provided. The apparatus comprises: a PCB having a contact; and an interconnect disposed in or on the PCB and including liquid metal, wherein the interconnect is configured to electrically connect the contact of the PCB to a contact of a DUT via the liquid metal.

In some embodiments, the interconnect includes a carrier defining a well, and wherein the liquid metal is disposed in the well.

In some embodiments, the carrier includes a carrier layer disposed on the PCB.

In some embodiments, the carrier is integrated into the PCB, and the well is formed in the PCB.

In some embodiments, the well is formed by a via disposed through the PCB from a first side of the PCB to a second side of the PCB, and a plug is disposed in a portion of the via adjacent the second side of the PCB to define the well.

In some embodiments, the liquid metal is configured to directly contact the contact of the DUT.

In some embodiments, the liquid metal is disposed between a top side of the well and the PCB, wherein the interconnect further includes a flex circuit that seals the top side of the well, and wherein the flex circuit includes a conductive pad to electrically couple the liquid metal to the contact of the DUT.

In some embodiments, the flex circuit is a top flex circuit, and wherein the interconnect further includes a bottom flex circuit disposed on a bottom side of the well, wherein the bottom flex circuit includes a conductive pad to electrically couple the contact of the PCB to the liquid metal.

In some embodiments, the carrier is formed of an elastomer.

In some embodiments, the carrier includes a plurality of wells, with liquid metal disposed in the wells corresponding to individual interconnects of a plurality of interconnects, the individual interconnects corresponding with individual contacts of a plurality of contacts of the PCB.

Another example provides a method of manufacturing an interconnect including: providing a printed circuit board (PCB) having a contact; and forming an interconnect in or on the PCB, wherein the interconnect includes liquid metal, and wherein the interconnect is configured to electrically connect the contact of the PCB to a contact of a device under test (DUT) via the liquid metal.

In some embodiments, forming the interconnect includes: forming a well in a carrier; and depositing the liquid metal in the well.

In some embodiments, the carrier includes a carrier layer disposed on the PCB.

In some embodiments, the carrier is integrated into the PCB, and wherein the well is formed in the PCB.

In some embodiments, the liquid metal is configured to directly contact the contact of the DUT.

In some embodiments, the liquid metal is disposed between a top side of the well and the PCB, and the forming the interconnect further includes coupling a flex circuit to the carrier, wherein the flex circuit covers the top side of the well, and wherein the flex circuit includes a conductive pad to electrically couple the liquid metal to the contact of the DUT.

In some embodiments, the flex circuit is a top flex circuit, and the forming the interconnect further includes coupling a bottom flex circuit to the carrier, wherein the bottom flex circuit covers a bottom opening of the well, and wherein the bottom flex circuit includes a conductive pad to electrically couple the contact of the PCB to the liquid metal.

Another example is a system for testing an integrated circuit assembly, the system including: an integrated circuit assembly having a plurality of contacts; a printed circuit board (PCB) having a plurality of contacts; and an interconnect assembly. The interconnect assembly includes: a carrier disposed in or on the PCB and having a plurality of wells; and liquid metal disposed in the wells to electrically couple respective contacts of the PCB to respective contacts of the integrated circuit assembly.

In some embodiments, the carrier is formed by a carrier layer disposed on the PCB.

In some embodiments, the carrier is integrated into the PCB, and the wells are formed in the PCB.

In some embodiments, the contacts of the integrated circuit assembly extend into the wells and are in direct contact with the liquid metal.

In some embodiments, the liquid metal is disposed between a top side of the carrier and the PCB, and the interconnect assembly further includes a flex circuit coupled to the top side of the carrier, wherein the flex circuit includes conductive pads to electrically couple the liquid metal in respective wells to the respective contacts of the integrated circuit assembly.

In some embodiments, the liquid metal is disposed between the top side of the carrier and a bottom side of the carrier, the flex circuit is a top flex circuit, and the interconnect assembly further includes a bottom flex circuit coupled to the bottom side of the carrier, wherein the bottom flex circuit includes a conductive pad to electrically couple the liquid metal in respective wells to respective contacts of the PCB.

In some embodiments, the integrated circuit assembly is directly coupled to the interconnect assembly.

In some embodiments, the system further includes: a space transformer coupled to the interconnect assembly to facilitate electrical connections between the interconnect assembly and the integrated circuit assembly; and a probe head coupled to the space transformer and configured to electrically couple the interconnect assembly to the integrated circuit assembly via the space transformer.

Various embodiments may include any suitable combination of the above-described embodiments. Furthermore, some embodiments may include one or more non-transitory computer-readable media having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An apparatus comprising:
a printed circuit board (PCB) having a contact; and
an interconnect disposed on the PCB and having:
   a carrier with a well that includes a liquid metal disposed in the well that is in direct physical contact with the contact of the PCB; and
   a flex circuit that seals the well on an opposite side of the well from the contact of the PCB;
wherein the interconnect is to electrically connect the contact of the PCB to a contact of a device under test (DUT) via the liquid metal when the contact of the DUT is coupled with the flex circuit.

2. The apparatus of claim 1, wherein the carrier includes a carrier layer disposed on the PCB.

3. The apparatus of claim 1, wherein the flex circuit includes a conductive pad to electrically couple the liquid metal to the contact of the DUT.

4. The apparatus of claim 3, wherein the carrier is formed of elastomer.

5. The apparatus of claim 1, wherein the carrier includes a plurality of wells, with liquid metal disposed in the wells corresponding to individual interconnects of a plurality of interconnects, the individual interconnects corresponding with individual contacts of a plurality of contacts of the PCB.

6. A method comprising:
providing a printed circuit board (PCB) having a contact disposed on a surface of the PCB;
providing an interconnect with a carrier having a well, a flex circuit covering a first side of the well, and a liquid metal in the well; and
coupling the interconnect to the surface of the PCB, wherein the contact of the PCB is disposed in a second side of the well opposite the first side of the well; and wherein the liquid metal is in direct physical contact with the contact of the PCB and is to electrically couple the contact of the PCB to a contact of a device under test (DUT).

7. The method of claim 6, wherein the carrier includes a carrier layer disposed on the PCB.

8. The method of claim 6, wherein the flex circuit includes a conductive pad to electrically couple the liquid metal to the contact of the DUT.

9. A system comprising:
an integrated circuit assembly having a plurality of contacts;
a printed circuit board (PCB) having a plurality of contacts; and
an interconnect assembly disposed on the PCB and including:
   a carrier having a plurality of wells that include a liquid metal disposed in the wells, the liquid metal in direct physical contact with the plurality of contacts of the PCB; and
   a flex circuit that seals the plurality of wells on an opposite side of the wells from the plurality of contacts of the PCB.

10. The system of claim 9, wherein the carrier includes a carrier layer disposed on the PCB.

11. The system of claim 9, wherein the contacts of the integrated circuit assembly extend into the wells and are in direct contact with the liquid metal.

12. The system of claim 9, wherein the flex circuit includes conductive pads to electrically couple the liquid metal in respective wells to the respective contacts of the integrated circuit assembly.

13. The system of claim 9, wherein the integrated circuit assembly is directly coupled to the interconnect assembly.

14. The system of claim 9, wherein the system further includes:
a space transformer coupled to the interconnect assembly to facilitate electrical connections between the interconnect assembly and the integrated circuit assembly; and
a probe head coupled to the space transformer and configured to electrically couple the interconnect assembly to the integrated circuit assembly via the space transformer.

15. An apparatus comprising:
a printed circuit board (PCB) having a well that is disposed in the PCB on a side of the PCB;
an electrical contact coupled to the PCB and disposed in the well of the PCB;
a liquid metal disposed in the well of the PCB and in direct physical contact with the electrical contact of the PCB; and
a flex circuit that seals the well on an opposite side of the well from the contact of the PCB;
wherein the liquid metal is to electrically connect the electrical contact of the PCB to a contact of a device under test (DUT) when the contact of the DUT is coupled with the flex circuit.

16. The apparatus of claim 15, wherein the side of the PCB is a first side and the well is formed by a via disposed through the PCB from the first side of the PCB to a second side of the PCB, and wherein a plug is disposed in a portion of the via adjacent the second side of the PCB to define the well on the first side of the PCB.

* * * * *